(12) United States Patent
Hirose et al.

(10) Patent No.: US 8,837,149 B2
(45) Date of Patent: Sep. 16, 2014

(54) ELECTRONIC COMPONENT AND METHOD OF MANUFACTURING ELECTRONIC COMPONENT

(75) Inventors: Shinichi Hirose, Kawasaki (JP); Taisuke Iwai, Kawasaki (JP); Yoshitaka Yamaguchi, Kawasaki (JP); Yohei Yagishita, Kawasaki (JP); Yukie Sakita, Kawasaki (JP); Masaaki Norimatsu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 325 days.

(21) Appl. No.: 13/307,029

(22) Filed: Nov. 30, 2011

(65) Prior Publication Data

US 2012/0218715 A1 Aug. 30, 2012

(30) Foreign Application Priority Data

Feb. 25, 2011 (JP) ................. 2011-039561

(51) Int. Cl.
*H05K 7/20* (2006.01)
*H01L 21/50* (2006.01)
*H01L 21/48* (2006.01)
*H01L 23/433* (2006.01)
*H01L 23/42* (2006.01)
*H01L 23/373* (2006.01)

(52) U.S. Cl.
CPC ............. *H01L 23/433* (2013.01); *H01L 21/50* (2013.01); *H01L 21/4871* (2013.01); *H01L 23/373* (2013.01); *H01L 23/3737* (2013.01)
USPC ................ 361/704; 361/679.54; 361/679.46; 361/705; 361/708; 361/709; 361/710; 165/80.2; 165/80.3; 165/104.33; 156/247; 156/249; 156/296; 427/200; 427/206; 428/113; 428/114; 428/118; 428/119; 428/364; 428/408; 264/271.1

(58) Field of Classification Search
USPC ....................... 361/679.46, 679.54, 704–712; 165/80.2, 80.3, 104.33, 185; 257/475, 257/625, 675, 706–727; 524/86, 99, 595, 524/871, 875, 495; 977/847, 848, 855, 856, 977/742; 427/200, 206, 523, 122, 198, 58, 427/97.7, 249.1, 447.5, 445 B, 445 R, 439, 427/447.2; 156/247, 249, 296; 428/86, 99, 428/113, 114, 118, 119, 293.1, 364, 92, 97, 428/368, 903, 411.1, 332, 323, 398, 402, 428/408; 264/261, 271.1
See application file for complete search history.

(56) References Cited

U.S. PATENT DOCUMENTS 7,524,557 B2 * 4/2009 Okamoto et al. ............. 428/323
7,569,619 B2 * 8/2009 Esaki et al. .................... 522/79
(Continued)

FOREIGN PATENT DOCUMENTS

JP 2005-150362 6/2005
JP 2006-100572 4/2006
(Continued)

*Primary Examiner* — Michail V Datskovskiy
(74) *Attorney, Agent, or Firm* — Fujitsu Patent Center

(57) ABSTRACT

A method of manufacturing an electronic component includes disposing a heat radiation material including a plurality of linear structures of carbon atoms and a filling layer of a thermoplastic resin provided among the plurality of linear structures above a first substrate, disposing a blotting paper above the heat radiation material, making a heat treatment at a temperature higher than a melting temperature of the thermoplastic resin and absorbing the thermoplastic resin above the plurality of linear structures with the absorption paper, removing the blotting paper, and adhering the heat radiation material to the first substrate by cooling to solidify the thermoplastic resin.

12 Claims, 17 Drawing Sheets

(56) References Cited

U.S. PATENT DOCUMENTS

| | | | |
|---|---|---|---|
| 7,931,958 B2* | 4/2011 | Arai et al. | 428/297.4 |
| 8,025,971 B2* | 9/2011 | Maeno et al. | 428/398 |
| 8,632,879 B2* | 1/2014 | Weisenberger | 428/332 |
| 2003/0096104 A1* | 5/2003 | Tobita et al. | 428/332 |
| 2005/0208301 A1* | 9/2005 | Okamoto et al. | 428/402 |
| 2005/0267230 A1* | 12/2005 | Esaki et al. | 522/172 |
| 2006/0065970 A1 | 3/2006 | Uchida et al. | |
| 2007/0116626 A1* | 5/2007 | Pan et al. | 423/447.1 |
| 2007/0116957 A1* | 5/2007 | Pan et al. | 428/408 |
| 2008/0193767 A1* | 8/2008 | Lee et al. | 428/408 |
| 2009/0068387 A1* | 3/2009 | Panzer et al. | 428/40.1 |

FOREIGN PATENT DOCUMENTS

| | | |
|---|---|---|
| JP | 2006-147801 | 6/2006 |
| JP | 2006-303240 | 11/2006 |

* cited by examiner

ELECTRONIC COMPONENT AND METHOD OF MANUFACTURING ELECTRONIC COMPONENT

CROSS REFERENCE TO RELATED APPLICATIONS

This application is based upon and claims the benefit of priority of the prior Japanese Patent Application No. 2011-039561, filed on Feb. 25, 2011, the entire contents of which are incorporated herein by reference.

FIELD

The embodiments discussed herein are related to an electronic component including a linear structure of carbon atoms and a method of manufacturing the electronic component.

BACKGROUND

The electronic components used in the CPUs (Central Processing Units), etc. of servers, personal computers, etc. are needed to have high radiation efficiency of heat generated by semiconductor elements. To this end, such electronic components have the structure that a heat spreader of a material of high thermal conductivity, such as copper, is provided above the semiconductor element.

In this structure, because of fine concavities and convexities present in the surface of the heat source and heat spreader, a sufficient contact area cannot be provided even with both being in direct contact with each other. The contact interface becomes a large thermal resistance, and the heat radiation cannot be sufficiently made. For the purpose of decreasing the thermal contact resistance, the heat source and the heat spreader are connected with a thermal interface material (TIM) provided therebetween.

To this end, the thermal interface material is required to be a material of high thermal conductivity itself and furthermore have the characteristics which allow itself to contact over a large area with the fine concavities and convexities in the surfaces of the heat source and the heat spreader.

As the thermal interface material, heat radiation grease, phase change material (PCM), indium, etc. have been conventionally used. One of major characteristics that makes such materials usable as the heat radiation material is that they have fluidity at temperatures lower than the heat resistance temperatures of the electronic devices, which allows them to have large contact areas with the fine concavities and convexities.

However, the heat radiation grease and phase change material have low thermal conductivities as low as 1 W/m·K-5 W/m·K. Indium, which is a rare metal and additionally whose demand is much increased in the ITO related fields, has become expensive, and more inexpensive substitute materials are expected.

In such background, as the heat radiation material, the linear structure of carbon atoms represented by the carbon nanotube is noted. The carbon nanotube not only has very high thermal conductivity (1500 W/m·K-3000 W/m·K) in the longitudinal direction but also is good in flexibility and heat resistance, and has high potential as a heat radiation material.

As the heat conductive sheet using the carbon nanotube, a heat conductive sheet with carbon nanotubes dispersed in a resin, and a heat conductive sheet having oriented carbon nanotube bundles on a substrate buried with a resin or others are proposed.

The followings are examples of related: Japanese Laid-open Patent Publication No. 2005-150362; Japanese Laid-open Patent Publication No. 2006-100572; Japanese Laid-open Patent Publication No. 2006-147801; and Japanese Laid-open Patent Publication No. 2006-303240.

However, the conventional heat conductive sheet using carbon nanotubes cannot sufficiently utilize the high thermal conductivity of the carbon nanotubes.

SUMMARY

According to one aspect of an embodiment, there is provided a method of manufacturing an electronic component including disposing a heat radiation material including a plurality of linear structures of carbon atoms and a filling layer of a thermoplastic resin provided among the plurality of linear structures above a first substrate, disposing a blotting paper above the heat radiation material, making a heat treatment at a temperature higher than a melting temperature of the thermoplastic resin and absorbing the thermoplastic resin above the plurality of linear structures with the absorption paper, removing the blotting paper, and adhering the heat radiation material to the first substrate by cooling to solidify the thermoplastic resin.

According to another aspect of an embodiment, there is provided an electronic component including a heat radiation board, and a heat radiation material formed above the heat radiation board, wherein the heat radiation material includes a plurality of linear structures of carbon atoms having one ends connected directly to the heat radiation board, a filling layer of a thermoplastic resin formed in contact with the heat radiation board and arranged among the plurality of linear structures, and a coating film formed above the other ends of the plurality of linear structures exposed from the filling layer and having a higher thermal conductivity than the thermoplastic resin.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

[A First Embodiment]

An electronic component and a method of manufacturing the same according to a first embodiment will be described with reference to FIGS. 1 to 12.

Figure 1:
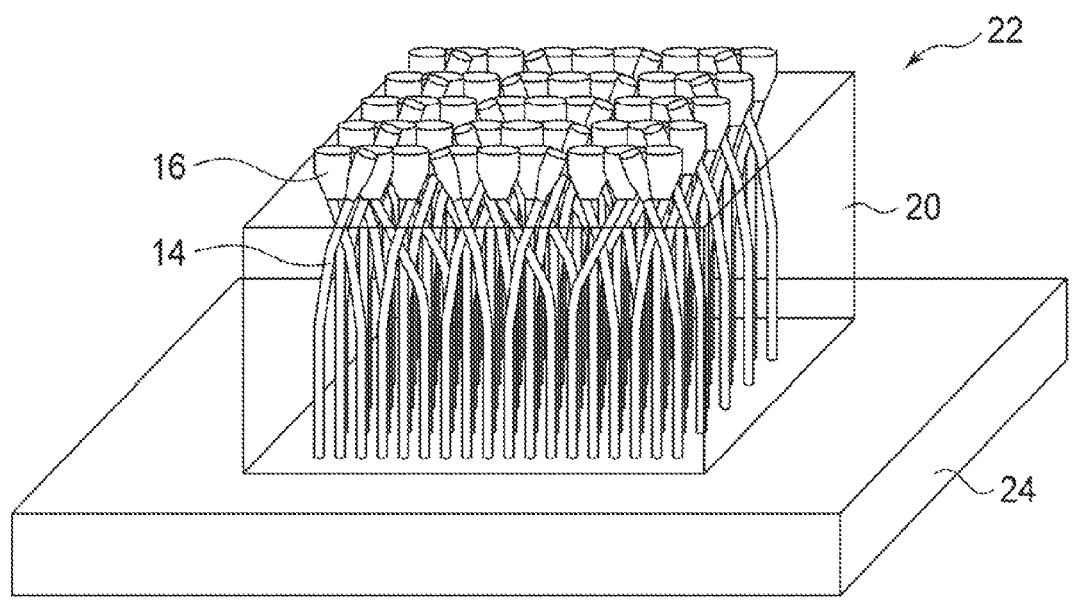
FIG. 1 is a perspective view illustrating a structure of an electronic component according to a first embodiment.

FIG. 1 is a perspective view illustrating a structure of the electronic component according to the present embodiment.

FIGS. 2-12 are perspective views illustrating a method of manufacturing the electronic component according to the present embodiment.

First, the structure of the electronic component according to the present embodiment will be described with reference to FIG. 1.

As illustrated in FIG. 1, the electronic component according to the present embodiment includes a carbon nanotube sheet 22 which is a sheet structure as a thermal interface material formed above a heat radiation board 24 as a heat spreader.

The carbon nanotube sheet 22 includes a plurality of carbon nanotubes 14 oriented in the direction of the thicknesswise of the sheet, i.e., in the direction crossing the surface of the sheet, and arranged, spaced from each other. The plurality of carbon nanotubes 14 has one ends (the lower ends as viewed in the drawing) in direct contact with the heat radiation board 24. On the other ends of the plurality of carbon nanotubes 14 (the upper ends as viewed in the drawing), a coating film 16 is formed. A filling layer 20 of a thermoplastic resin is formed in the intervals among the carbon nanotubes 14, and the carbon nanotubes 14 are supported by the filling layer 20. The ends of the carbon nanotubes 14 with the coating film 16 formed on are exposed from the filling layer 20.

The carbon nanotubes 14 can be either of single-walled carbon nanotubes or multi-walled carbon nanotubes. The surface density of the carbon nanotubes 14 is not especially limited but, for the heat radiation and the electric conduction, is preferably $1 \times 10^{10}$ tubes/cm$^2$ or more.

The length of the carbon nanotubes 14 is not especially limited but can be set preferably at a value of about 5 μm-500 μm. In the case that, as in the present embodiment, the carbon nanotube sheet 22 is used as the thermal interface material formed between a heat source (e.g., an IC chip) and a heat radiation component (e.g., a heat spreader), preferably the length of the carbon nanotubes 14 is larger than at least a length that is enough to fill the concavities and convexities on the surfaces of the heat source and the heat radiation component.

As described above, one ends of the plurality of carbon nanotubes 14 are in contact with the heat radiation board 24 not interposing the thermoplastic resin of the filling layer 20, whereby the thermal contact resistance between the carbon nanotubes 14 and the head radiation board 24 can be drastically decreased, and the thermal conductivity between the carbon nanotubes and the heat radiation board 24 can be drastically increased.

The other ends of the plurality of carbon nanotubes 14 are exposed from the surface of the filling layer 20, whereby when the carbon nanotube sheet 22 contacts a heating body, the ends of the carbon nanotubes covered by the coating film 16 can contact directly the heating body. Thus, the thermal contact resistance between the carbon nanotubes 14 and the heating body can be drastically decreased, and the thermal conductivity between the carbon nanotubes 14 and the heating body can be drastically increased.

Thus, the heat emitted from the heating body can be efficiently conducted to the heat radiation board 24 via the carbon nanotube sheet 22 and radiated, whereby the temperature rise of the heating body can be suppressed.

The coating film 16 is for decreasing the thermal contact resistance of the carbon nanotubes 14 to the heating body. The presence of the coating film 16 can increase the contact area of the carbon nanotube sheet 22 to the heating body in comparison with the absence of the coating film 16, whereby the thermal contact resistance between the carbon nanotube sheet 22 and the heating body is decreased, and the thermal conductivity of the carbon nanotube sheet 22 can be increased.

Even in the case that the length of the carbon nanotubes 14 fluctuates, and parts of the carbon nanotubes 14 cannot contact directly the heating body, a substantial number of those of the carbon nanotubes 14, which contribute to the heat radiation can be made larger owing to the transverse heat conduction via the coating film 16. Thus, the thermal conductivity of the carbon nanotube sheet 22 can be increased.

The material of the coating film 16 is not especially limited as long as the material has a high thermal conductivity, e.g., has a higher thermal conductivity than the thermoplastic resin forming the filling layer 20.

The film thickness of the coating film 16 is not especially limited as long as the coating film 16 does not hinder the permeation of the thermoplastic resin film in the manufacturing process. Preferably, the film thickness of the coating film 16 is set suitably corresponding to the permeability of the thermoplastic resin film 18, characteristics required of the carbon nanotube sheet 22, the constituent material of the coating film 16, etc.

The thermal resistance of the coating film 16 is preferably not more than 1/100 of the thermal resistance of the carbon nanotubes 14. This is because when the thermal resistance of the coating film 16 is too large, the high thermal conductivity of the carbon nanotubes 14 cannot be sufficiently utilized. That is, preferably, the relationship:

$$\lambda cnt \times Tcnt > \lambda coat \times Tcoat \times 100$$

wherein the length of the carbon nanotubes 14 is Tcnt, the thermal resistivity of the carbon nanotubes 14 is λcnt, the thickness of the coating film 16 is Tcoat, and the thermal resistivity of the coating film 16 is λcoat.

The filling layer 20 is formed of a thermoplastic resin. The thermoplastic resin forming the filling layer 20 is not especially limited as long as the thermoplastic resin reversibly changes the state between liquid and solid, is solid at room temperature, changes to liquid when heated, and returns to solid when cooled, exhibiting adhesiveness.

The thermoplastic resin forming the filling layer 20 can be selected based on the melting temperature of the thermoplastic resin corresponding to a heating temperature of the heating body for the electronic component according to the present embodiment to be connected to. Preferably, the lower limit value of the melting temperature of the thermoplastic resin is higher than the upper limit value of the heating temperature in operation. This is because when the thermoplastic resin melts in operation, there is a risk, for example, that the carbon nanotube sheet 22 will be deformed, damaging the orientation of the carbon nanotubes 14, and resultantly the heat conduction will be lowered. Preferably, the upper limit value of the melting temperature of the thermoplastic resin is lower than the lower limit value of the heat resistance temperature of the heating body and the heat radiation body. This is because that the filling layer 20 for the carbon nanotube sheet 22 is reflowed preferably after contacted to the heating body, but when the melting temperature of the thermoplastic resin is higher than the heat resistance temperature, it is difficult to make the reflow without damaging the heating body and/or the heat radiation body.

For example, when the electronic component according to the present embodiment is used in the heat radiation of electronic devices, such as CPU, etc., a thermoplastic resin whose melting temperature is 125° C.-250° C. is suitable, considering that the heat resistance temperature of the CPU in operation is about 125° C. and the heat resistance temperature of the CPU is about 250° C.

In the filling layer 20, as required, an additive may be mixed disperse. As the additive, for example, a substance of high thermal conductivity is considered. An additive of high thermal conductivity is mixed disperse in the filling layer 20, whereby the thermal conductivity of the filling layer 20 can be improved, and the thermal conductivity of the carbon nanotube sheet 22 as a whole can be improved. As the material of high thermal conductivity, carbon nanotube, a metal material, aluminum nitride, silica, alumina, graphite, fullerene or others can be used.

The heat radiation board 24 is formed of a material of high thermal conductivity, such as copper, and is for radiating heat generated from the heating body (e.g. IC chips) connected via the carbon nanotube sheet 22.

Next, the method of manufacturing the electronic component according to the present embodiment will be described with reference to FIGS. 2 to 12.

First, a substrate 10 to be used as the base for growing the carbon nanotubes 14 is prepared. The substrate 10 is not especially limited and can be, e.g., a semiconductor substrate, such as a silicon substrate or others, an insulating substrate, such as an alumina (sapphire) substrate, an MgO substrate, a glass substrate or others. A thin film may be formed on such substrate. For example, a silicon substrate with an about 300 nm thickness silicon oxide film formed on may be used.

The substrate 10 is to be removed after the carbon nanotubes 14 have been grown. To this end, preferably, the substrate 10 is not deformed at the growing temperature of the carbon nanotubes 14. Preferably, at least the surface of the substrate 10 to contact with the carbon nanotubes 14 is formed of a material which is easily removable from the carbon nanotubes 14. Otherwise, the substrate 10 may have at least the parts to contact the carbon nanotubes 14 formed of a material which can be etched selectively to the carbon nanotubes 14.

Then, above the substrate 10, an Fe (iron) film of, e.g., a 2.5 nm thickness is formed by, e.g., sputtering method to form a catalytic metal film 12 of Fe. The catalytic metal film 12 may not be formed essentially on the entire surface of the substrate 10 and may be formed selectively on a prescribed region of the substrate 10 by, e.g., lift-off method.

As the catalytic metal, other than Fe, Co (cobalt), Ni (nickel), Au (gold), Ag (silver), Pt (platinum) or an alloy containing at least one of them may be used. As the catalyst, other than a metal film, metal particles the size controlled in advance by a DMA (Differential Mobility Analyzer) or others may be used, and in this case, the metal species can be the same as that of the thin film.

As the base film of the catalytic metal, a film of Mo (molybdenum), Ti (titanium), Hf (hafnium), Zr (zirconium), Nb (niobium), V (vanadium), TaN (tantalum nitride), $TiSi_x$ (titanium silicide), Al (aluminum), $Al_2O_3$ (aluminum oxide), $TiO_x$ (titanium oxide), Ta (tantalum), W (tungsten), Cu (copper), Au (gold), Pt (platinum), Pd (palladium), TiN (titanium nitride), or an alloy containing at least one of these materials may be formed. For example, the layer structure of Fe (2.5 nm)/Al (10 nm), the layer structure of Co (2.6 nm)/TiN (5 nm), etc. can be used. When metal particles are used, the layer structure of, e.g., Co (the average diameter: 3.8 nm)/TiN (5 nm) or others may be used.

Then, above the substrate 10, the carbon nanotubes 14 are grown by, e.g., hot filament CVD method with the catalytic metal film 12 as the catalyst. The conditions for growing the carbon nanotubes 14 are, e.g., the mix gas of acetylene and argon (the partial pressure ratio: 1:9) as the raw material gas, 1 kPa total gas pressure in the film forming chamber, 1000° C. hot filament temperature, 20 minutes growth period of time.

Thus, 3-6 walls (about 4 walls on average) of carbon nanotubes of a 4 nm-8 nm diameter (6 nm on average) and an 80 μm length (the growth rate: 4 μm/min) can be grown. The carbon nanotubes 14 may be formed by another film forming method, such as thermal CVD method, remote plasma CVD method or others. The carbon nanotubes to be grown may be single-walled carbon nanotubes. As the carbon raw material, other than acetylene, hydrocarbons, such as methane, ethylene, etc., alcohols, such as ethanol methanol, etc., or others may be used.

The length of the carbon nanotubes 14 is not especially defined but can be set preferably at about 5 μm-500 μm. In the case that the carbon nanotubes 14 are used as a thermal interface material, the length of the carbon nanotubes 14 is preferably at least a length which allows the carbon nanotubes 14 to fill the concavities and convexities in the surfaces of the heating source and the heat radiation component.

Figure 2:
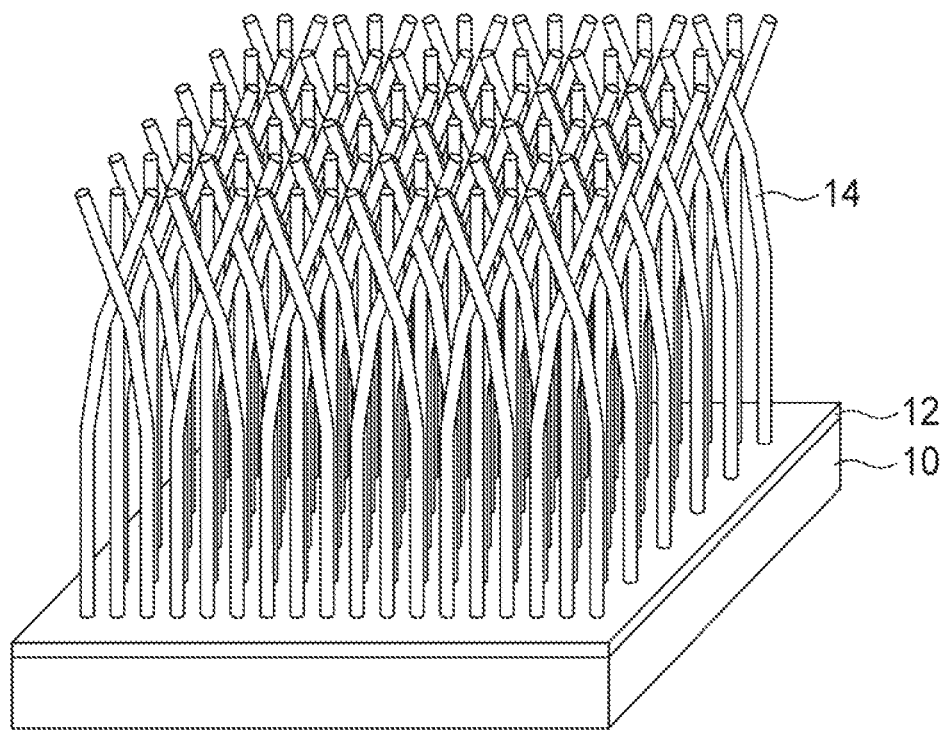
FIGS. 2-12 are perspective views illustrating a method of manufacturing the electronic component according to the first embodiment.

Thus, a plurality of the carbon nanotubes 14 oriented in the normal direction of the substrate 10 (vertical orientation) are formed above the substrate 10 (FIG. 2). The carbon nanotubes 14 formed under the above-described growth condition had a surface density of about $1 \times 10^{11}$ tubes/cm². This corresponds the carbon nanotubes 14 formed in a region which is about 10% of the area of the surface of the substrate 10.

Then, as required, Au (gold) of, e.g., an about hundreds nm thickness is deposited above the carbon nanotubes 14 by, e.g., evaporation method to form the coating film 16 of Au. The coating film 16 may be formed by another film forming process (e.g., sputtering method or others) as long as the process does not damage the carbon nanotubes 14.

The material forming the coating film 16 is not essential, but a material of high thermal conductivity is preferable. When the carbon nanotubes 14 are used in an electric conduction application, the coating film 16 can be formed of a conductive material, e.g., a metal, an alloy of the metal or others. As a constituent material of the coating film 16, for example, copper (Cu), nickel (Ni), gold (Au), indium (In) or others can be used. The coating film 16 is not essentially a single layer structure and can be a layer structure of, e.g., titanium (Ti) and gold (Au) or others, a layer structure of 2 layers, 3 layers or more layers.

Figure 3:
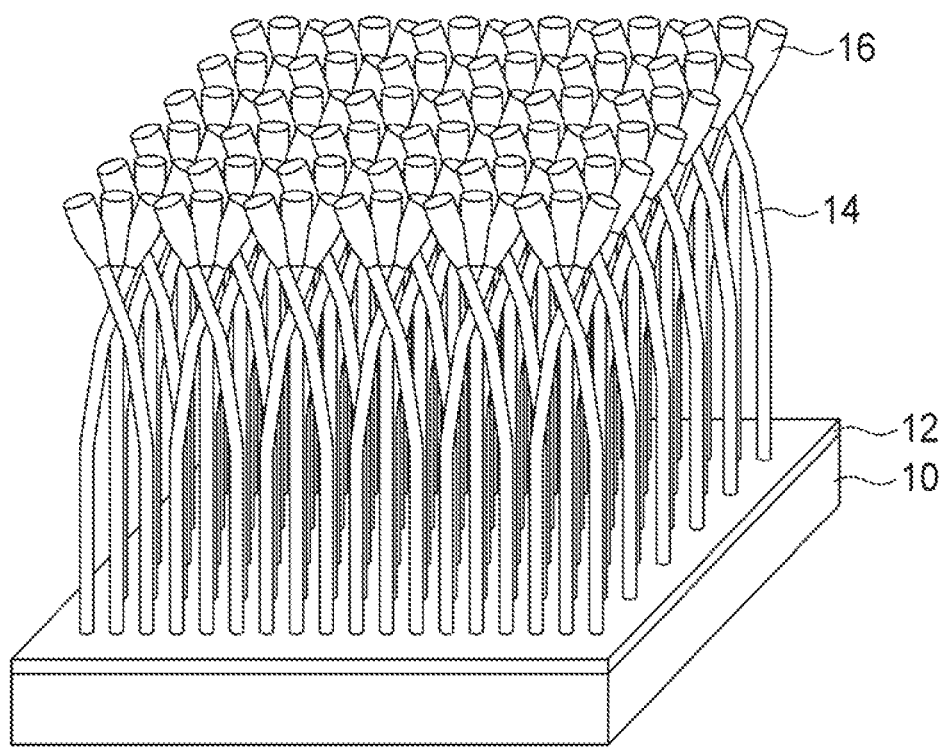
Figure 4:
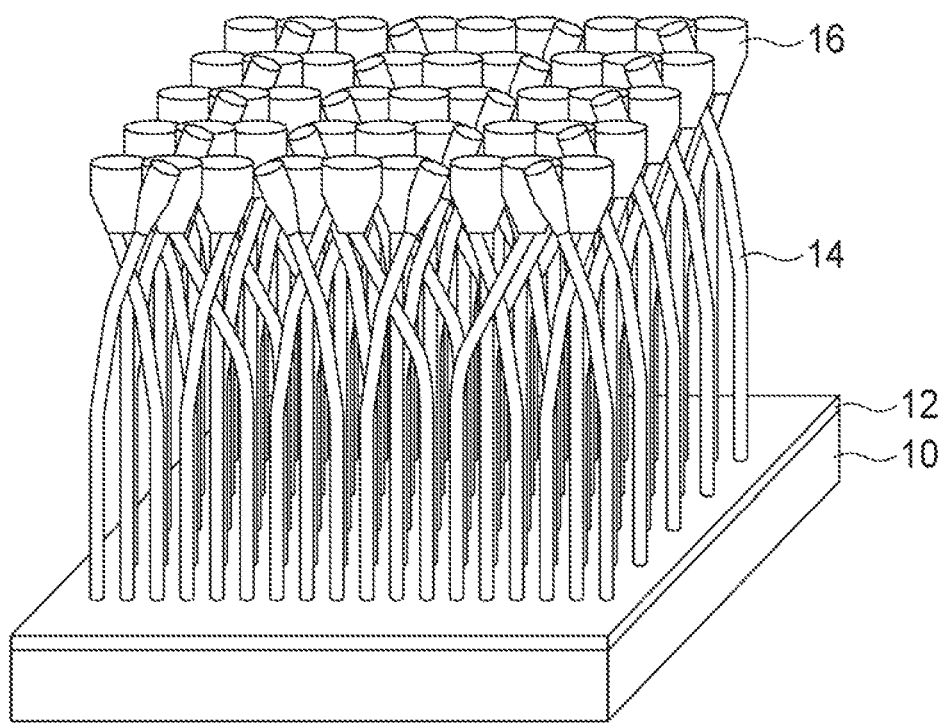

The coating film 16 is formed in the initial growth stage, covering the forward ends of the respective carbon nanotubes as exemplified in FIG. 3. As the growing film thickness increases, the coating film 16 formed on the forward ends of the respective carbon nanotubes neighboring one another joints. Thus, the coating film 16 is formed, bundling the forward ends of plural ones of the respective carbon nanotubes 14. As the growing film thickness of the coating film 16 further increases, the coating film 16 completely joints in the two-dimensional direction parallel to the surface of the sheet and becomes a complete film without gaps.

Preferably, the film thickness of the coating film 16 is suitably set corresponding to a diameter and a surface density of the carbon nanotubes 14, considering the permeability, etc. of the filling material (thermoplastic resin) for forming the filling layer 20.

For example, when the diameter of the carbon nanotubes 14 is 10 nm, and the surface density thereof is $1 \times 10^{11}$ cm$^{-2}$, the gap between the neighboring carbon nanotubes 14 is about 50 nm. In this case, in order to connect the neighboring carbon nanotubes 12 by the coating film 16, preferably the coating film 16 is formed in a film thickness of at least a half or more of the gap, i.e., a film thickness of about 25 nm or more. When the coating film 16 is formed too thick, the coating film 16 becomes a perfect film without any gap, which lowers the permeability of the filling material, and accordingly, the upper film thickness limit of the coating film 16 is set preferably based on the permeability of the filling material. In view of this, for the carbon nanotubes 14 of the above-described conditions, the film thickness of the coating film 16 is set preferably at about 25 nm-1000 nm.

Figure 6:
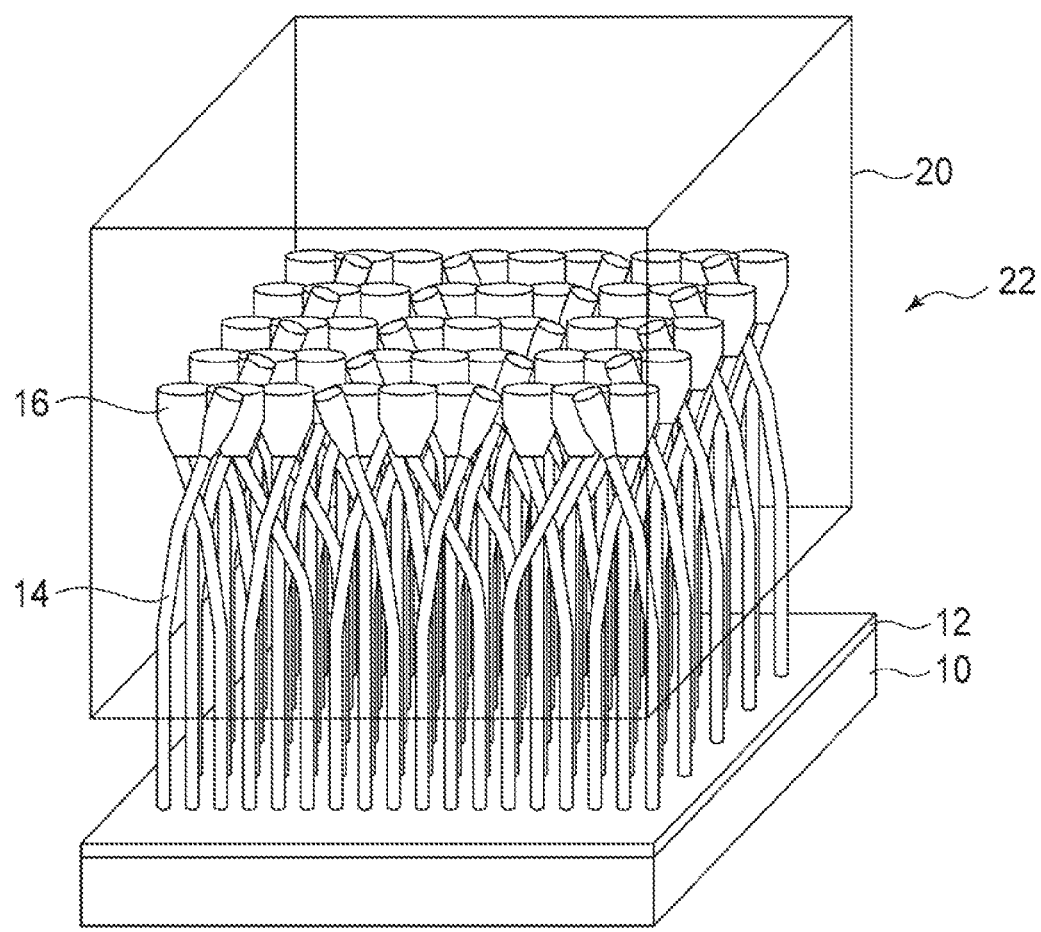

Forming the coating film 16 in a film thickness sufficient to joint the carbon nanotubes 14 neighboring one another is not essential but has the effect of bundling plural ones of the carbon nanotubes 14 by the coating film 16 (see FIG. 6). This prevents the carbon nanotubes 14 from separating from one another when the filling layer 20 is permeated among the carbon nanotubes 14. The transverse heat conduction through the coating film 16 is made possible.

Figure 5:
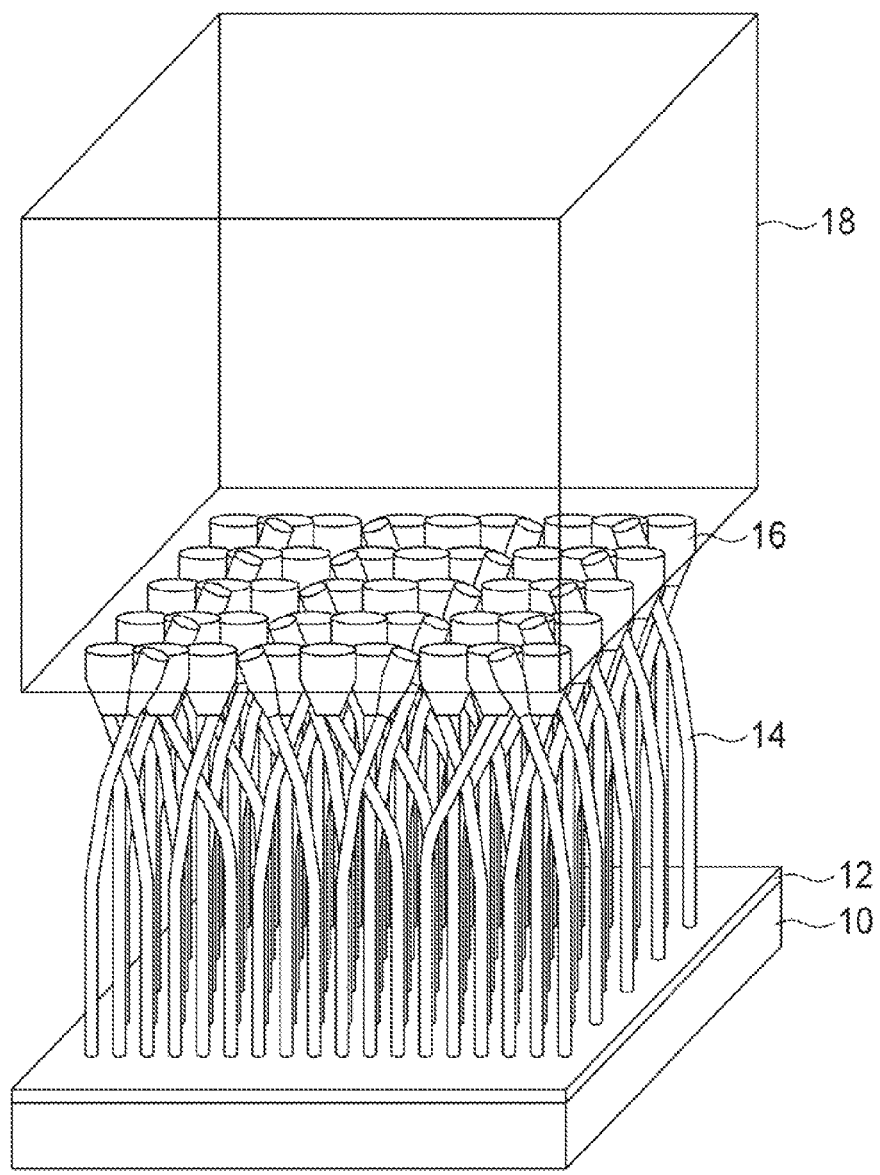

Then, above the carbon nanotubes 14 with the coating film 16 formed on, a thermoplastic resin formed in film (the thermoplastic resin film 18) is mounted (FIG. 5).

As the thermoplastic resin of the thermoplastic resin film 18, for example, the hot melt resins to be described below. As polyamide-based hot melt resin, "Micromelt 6239" from Henkel Japan Ltd., for example, may be applied. As polyester-based hot melt resin, "DH598B" from Nogawa Chemical Co., Ltd., for example, may be applied. As polyurethane-based hot melt resin, "DH722B" from Nogawa Chemical Co., Ltd., for example, may be applied. As polyolefin-based hot melt resin, "EP-90" from Matsumura Oil Co., Ltd., for example, may be applied. As ethylene copolymer hot melt resin, "DA574B" from Nogawa Chemical Co., Ltd., for example, may be applied. As SBR-based hot melt resin, "M-6250" from Yokohama Rubber Co., Ltd., for example, may be applied. As EVA-based hot melt resin, "3747" from Sumitomo 3M Ltd., for example, may be applied. As butyl rubber-based hot melt resin, "M-6158" from Yokohama Rubber Co., Ltd., for example, may be applied.

As one example here, the case that the thermoplastic resin film 18 is formed of "Micromelt 6239" from Henkel Japan Ltd. processed in a 100 μm thickness film will be described. "Micromelt 6239" is a hot melt resin of a 135° C.-145° C. melting point and a 5.5 Pa·s-8.5 Pa·s (225° C.) molten resin viscosity.

Then, the substrate 10 with the thermoplastic resin film 18 mounted on is heated at, e.g., 195° C. As required, the substrate 10 may be pressed at the thermoplastic resin film 18. Thus, the thermoplastic resin of the thermoplastic resin film 18 is melted gradually into the gaps among the carbon nanotubes 14. Thus, the thermoplastic resin film 18 is caused to permeate down to a level where the thermoplastic resin does not reach the surface of the substrate 10.

The thermoplastic resin is processed in a sheet in advance, whereby the quantity of the filling material can be controlled by the sheet film thickness. Thus, the heating temperature and the heating period of time are controlled, whereby the filling material can be controlled not to permeate down to the substrate 10.

The permeation of the thermoplastic resin film 18 is stopped before the thermoplastic resin film 18 does not reach the substrate 10 so as to make it easy to peel the carbon nanotubes 14 and the thermoplastic resin film from the substrate 10. When the adhesiveness of the thermoplastic resin film 18 to the substrate 10 is low, the thermoplastic resin film 18 may be caused to permeate down to the substrate 10.

The thickness of the thermoplastic resin film 18 permeating in the gaps among the carbon nanotubes 14 can be controlled by the heat processing period of time. For example, for the carbon nanotubes 12 of 80 μm length grown under the above-described conditions, the heat processing is made at 195° C. for 1 minute, whereby the thermoplastic resin film 18 can be permeated down to the level where the thermoplastic resin film 18 does not reach the substrate 10.

Preferably, the heating period of time for the thermoplastic resin film 18 is suitably set corresponding to a length of the carbon nanotubes 14, a viscosity of the molten thermoplastic resin, a film thickness of the thermoplastic resin film 18, etc. so as to be permeate the thermoplastic resin film 18 down to the level where the thermoplastic resin film 18 does not reach the substrate 10.

The thermoplastic resin is processed in advance preferably in film but may be formed in pellets or bars.

Then, after the thermoplastic resin film 18 is permeated down to a prescribed position, the thermoplastic resin film 18 is cooled down to room temperature to be solidified. Thus, the filling layer formed of the thermoplastic resin of the thermoplastic resin film 18 and filled in the gaps among the carbon nanotubes 14 is formed (FIG. 6).

Figure 7:
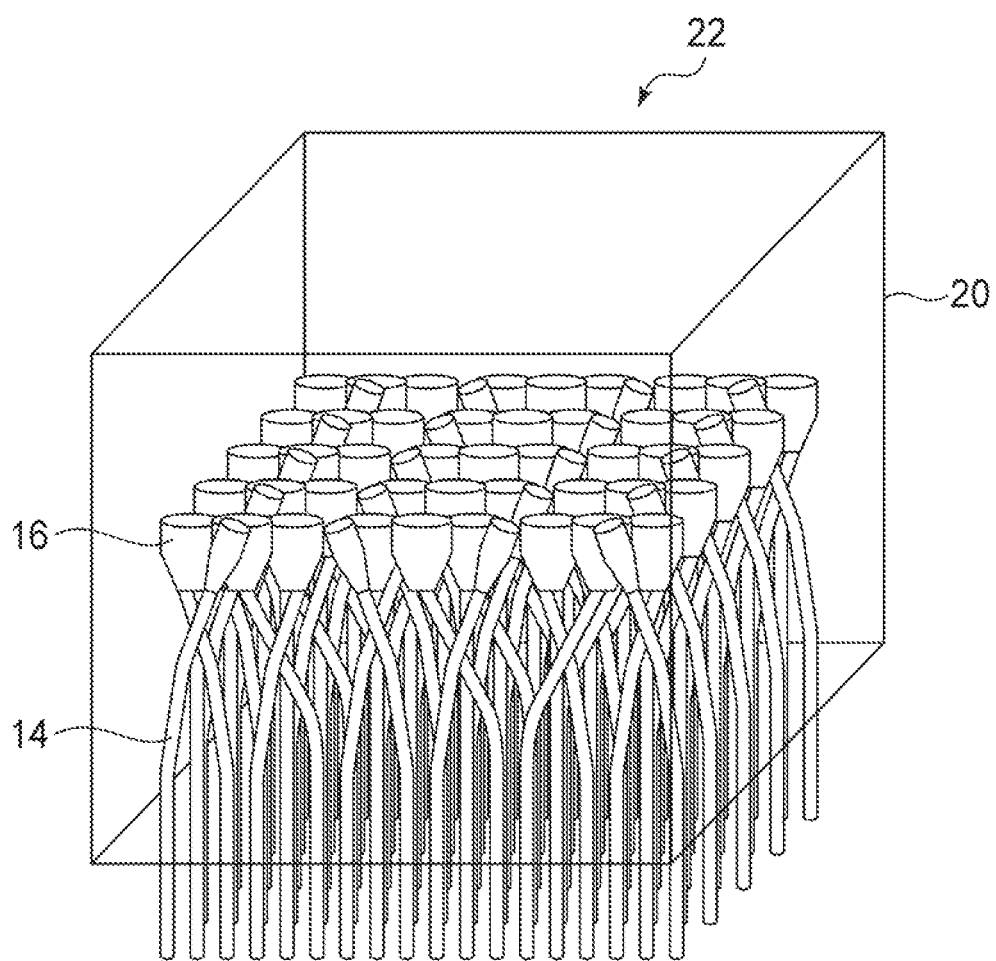

Next, the carbon nanotubes 14 and the filling layer 20 are peeled from the substrate 10, and the carbon nanotube sheet 22 as the thermal interface material is formed (FIG. 7).

Then, as required, the same coating film as the coating film 16 may be formed above the ends of the carbon nanotubes 14 from which the substrate 10 has been removed.

Figure 8:
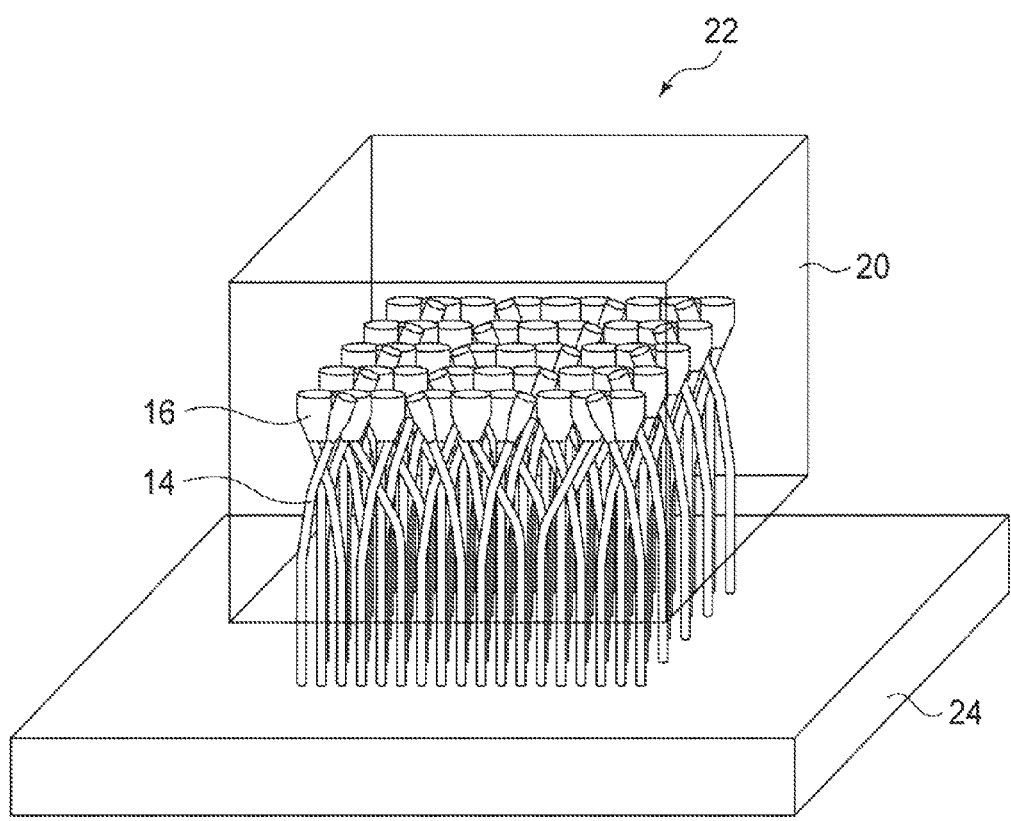

Then, above the heat radiation board 24, such as a heat spreader or others, the carbon nanotube sheet 22 is mounted with the ends of the carbon nanotubes 14 on the side from which the substrate has been removed positioned on the side of the heat radiation board 24 (FIG. 8). The ends of the carbon nanotubes 14 on the side from which the substrate 10 has been removed are formed in flat surfaces reflecting the surface of the substrate 10 and are not covered by the filling layer 20, and are surely contacted to the surface of the heat radiation board 24.

Then, above the filling layer 20 of the carbon nanotube sheet 22, a blotting paper 26 is mounted. The blotting paper 26 is a sheet of a material which can absorb the molten thermoplastic resin material. The general blotting paper is a fibrous material having a suitable large number of gaps formed by surface treatment and is formed, e.g., of a surface paper composed of a used pulp by 100% and a main body composed of a used pulp by 70%. Such blotting paper 26 is exemplified by "SHIMU-1N" from Kokuyo Co., Ltd. or others.

Figure 9:
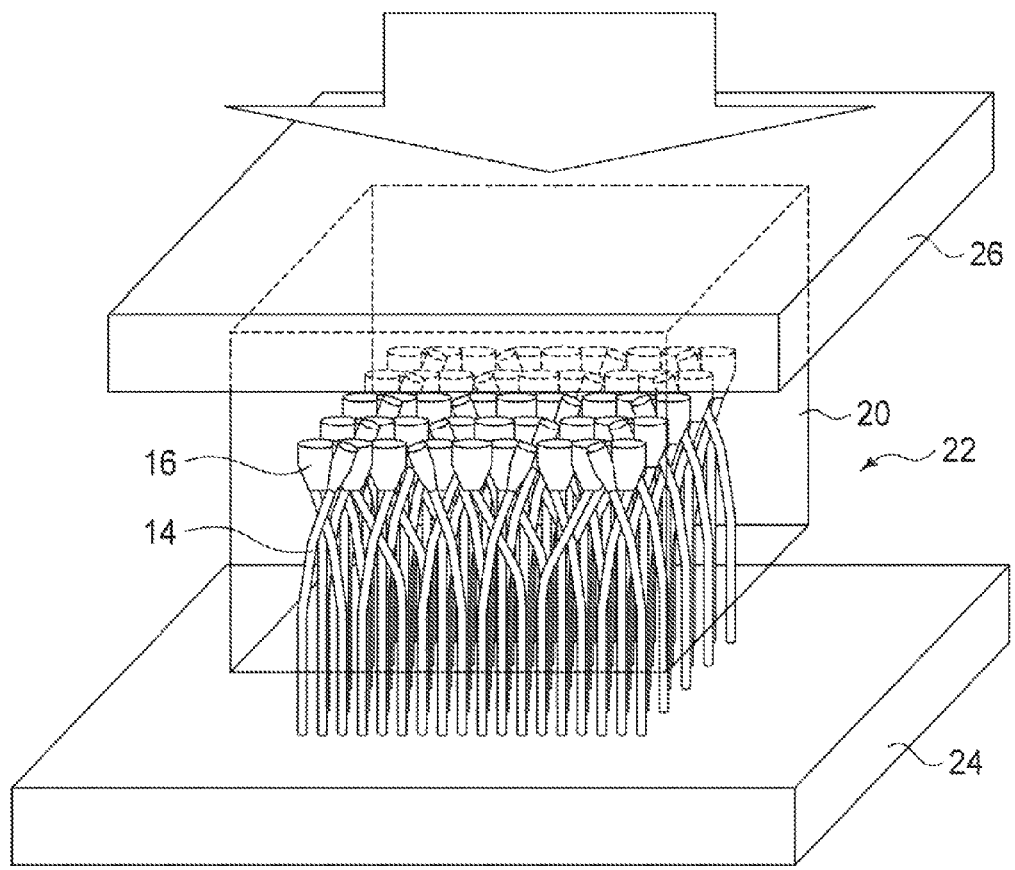

Next, in the state heated at the melting temperature of the thermoplastic resin of the filling layer 20, e.g., 195° C., the filling layer 20 is pressed at the blotting paper 26 (FIG. 9). Thus, the filling layer 20 is permeated among the carbon nanotubes 14 down to the heat radiation board 24. The pressure to be applied onto the blotting paper 26 is not especially limited as long as the pressure causes no configurational change to the carbon nanotubes 14, and, for example, a weight of about hundreds grams can be mounted.

The blotting paper 26 is used so as to absorb excessive one of the thermoplastic resin of the filling layer 20 and prevent the scatter of the carbon nanotubes 14. For example, when the film thickness of the thermoplastic resin film 18 is extremely thick in comparison with the length of the carbon nanotubes 14, the pressure applied in permeating the thermoplastic resin film 18 spreads the thermoplastic region also transversely, often scattering the carbon nanotubes 14. When the carbon nanotubes 14 scatter, the carbon nanotubes 14 lose the orientation, which causes the thermal contact resistance increase and the heat conductivity reduction. Excessive one of the thermoplastic resin is absorbed by the blotting paper 26, whereby the filling layer 20 can be easily permeated down to the heat radiation board 24 without scatting the carbon nanotubes 14.

The use of the blotting paper 26 also has the merit that the allowable range of the thickness of the thermoplastic resin film 18 to be used can be large. This increases the freedom degree of using the thermoplastic resin films on the market, and the productivity can be increased. Thermoplastic resin films are available on the market, and of them, thin thermoplastic films generally have an about 100 μm film thickness. For the carbon nanotubes 14 of a tens μm length, the use of the thermoplastic film 18 available on the market is especially effective.

Figure 10:
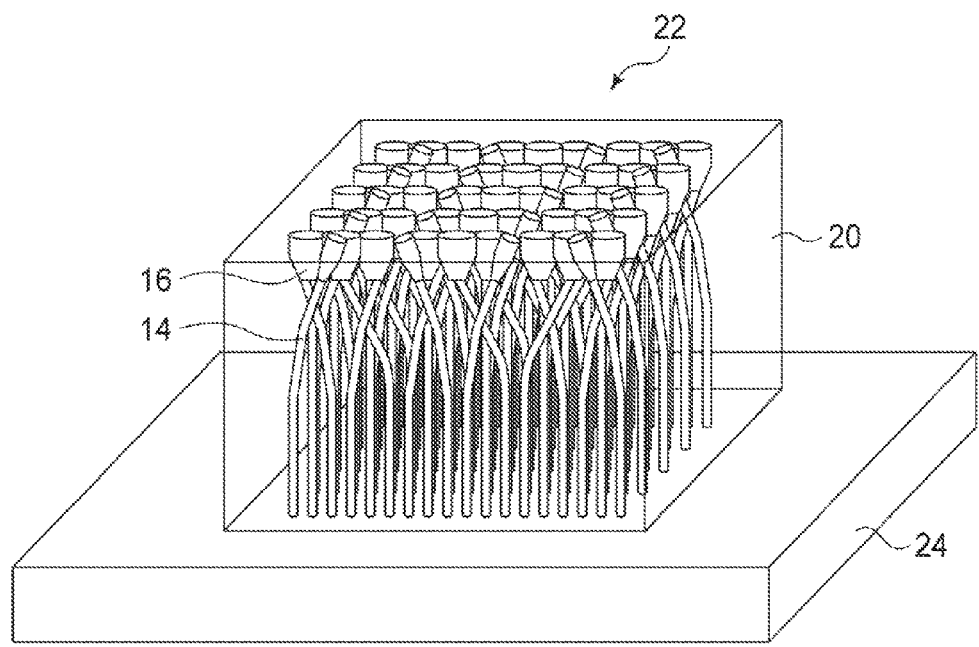

Next, in the heated state, the blotting paper 26 is removed, and the filling layer 20 is cooled to room temperature to solidify the thermoplastic resin of the filling layer 20. At this time, the thermoplastic resin exhibits the adhesiveness, and the heat radiation board 24 and the carbon nanotube sheet 22 are adhered (FIG. 10).

The processing of permeating the filling layer down to the heat radiation board 24, and the processing of absorbing excessive one of the thermoplastic resin by the blotting paper 26 can be separately made.

For example, first, above the filling layer 20 of the carbon nanotube sheet 22, a board (hereinafter called "a press board") of material which is not adhesive to the thermoplastic resin is mounted. As the press board, for example, a Teflon (registered trademark) board or a release paper adhered to the commercially available thermoplastic resin film can be used.

Next, in the state heated at the melting temperature of the thermoplastic resin of the filling layer 20, e.g., 195° C., the filling layer 20 is pressed at the press board and permeates down to the heat radiation board 24.

Next, the filling layer 20 is cooled to room temperature, and the press board is removed.

Next, above the filling layer 20 of the carbon nanotube sheet 22, the blotting paper 26 is mounted.

Next, in the stated heated at the melting temperature of the thermoplastic resin of the filling layer 20, e.g., 195° C., the filling layer 20 is pressed at the blotting paper 26, and excessive one of the thermoplastic resin of the filling layer 20 is absorbed by the blotting paper 26.

Then, in the heated state, the blotting paper 26 is removed, and the filling layer 20 is cooled to room temperature to solidify the thermoplastic resin of the filling layer 20.

Thus, the filling layer 20 is permeated down to the heat radiation board 24 while excessive one of the thermoplastic resin is absorbed by the blotting paper 26.

The thermoplastic resin of the filling layer 20 goes on permeating with the ends of the carbon nanotubes 14 and the heat radiation board 24 in contact with each other, and the thermoplastic resin never intrudes into the interfaces between the carbon nanotubes 14 and the heat radiation board 24. Thus, the increase of the thermal contact resistance between the carbon nanotubes 14 and the heat radiation board 24 can be prevented.

Figure 11:
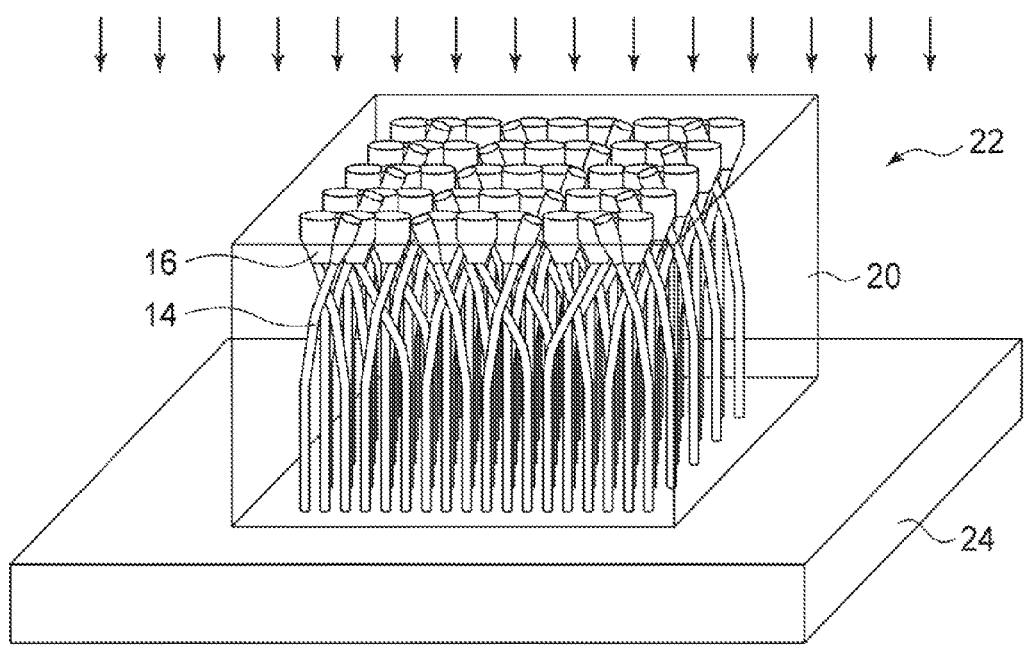

Then, as required, the processing of removing the surface of the filling layer 20 is made (FIG. 11). This processing is made in consideration of the case that the thermoplastic resin on the coating film 16 cannot be sufficiently removed by the blotting paper 26 alone.

In the processing of removing the surface of the filling layer 20, for example, dry etching or wipe-off with an organic solvent, such as ethanol or others, can be used. In the dry etching, for example, the processing of tens watts and several minutes can be made with a parallel plate dry etching system using oxygen as the etching gas. The coating film 16 also has the role of protecting the carbon nanotubes 14 in etching the thermoplastic resin of the filling layer 20.

It is an idea to remove excessive one of the thermoplastic resin by dry etching alone without absorbing the excess of the thermoplastic resin by the blotting paper 26, but unpreferably, the processing period of time of the dry etching increases. When the processing period of time of the dry etching increases, the thermoplastic resin is melted by temperature increases, and the orientation of the carbon nanotubes 14 is often affected. In view of this, the removal of the thermoplastic resin by the dry etching is made preferably after excessive one of the thermoplastic resin has been removed by the blotting paper 26.

Figure 12:
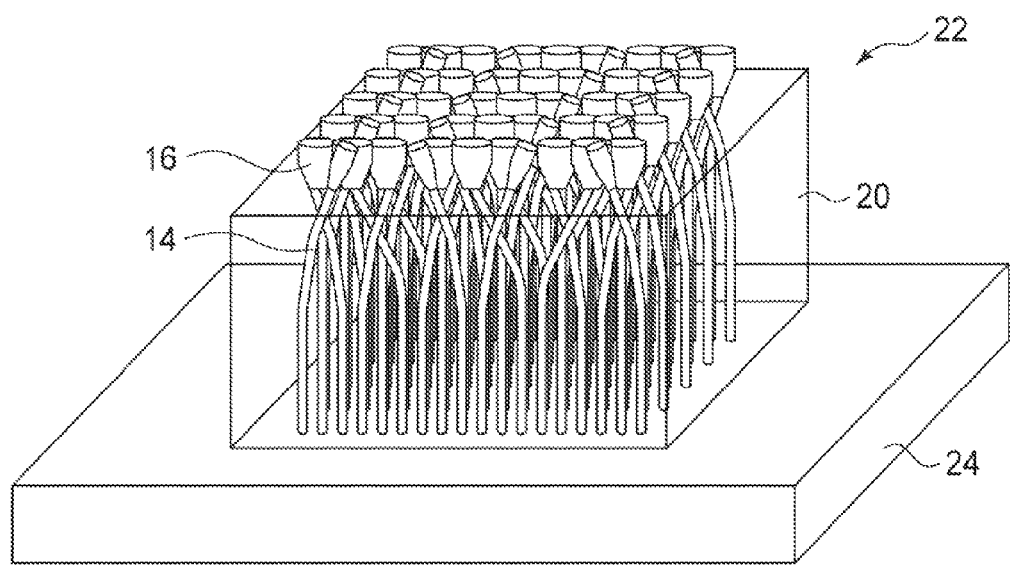

Thus, the ends of the carbon nanotubes 14, which are covered by the coating film 16 can be exposed from the surface of the filling layer 20 (FIG. 12).

Thus, the electronic component according to the present embodiment having the carbon nanotube sheet 22 as the thermal interface material formed integral on the heat radiation board 24 is completed.

As described above, according to the present embodiment, in the thermo compression bonding of the carbon nanotube sheet to the heat radiation board, excessive one of the thermoplastic resin is absorbed by pressing the carbon nanotube sheet via the blotting paper, whereby the scatter of the carbon nanotubes by the spreading of the thermoplastic resin can be prevented. Thus, the thermal resistance increase of the carbon nanotube sheet itself and the increase of the thermal contact resistance thereof to the heat radiation board can be prevented.

According to the present embodiment, one ends of the carbon nanotubes can be contact directly the heat radiation body. Thus, the thermal contact resistance between the carbon nanotube sheet and the heat radiation body can be drastically decreased. The other ends of the carbon nanotubes are exposed from the filling layer, whereby when the carbon nanotube sheet is brought into contact with the heating body, the other ends of the carbon nanotubes can be contacted directly to the heating body. Thus, the thermal contact resistance between the carbon nanotube sheet and the heating body can be drastically deceased. Accordingly, the heat generated from the heating body can be highly efficiently radiated from the heat radiation body. The reliability of electronic devices can be increased.

[A Second Embodiment]

An electronic component and a method of manufacturing the same according to a second embodiment will be described with reference to FIG. 13.

Figure 13:
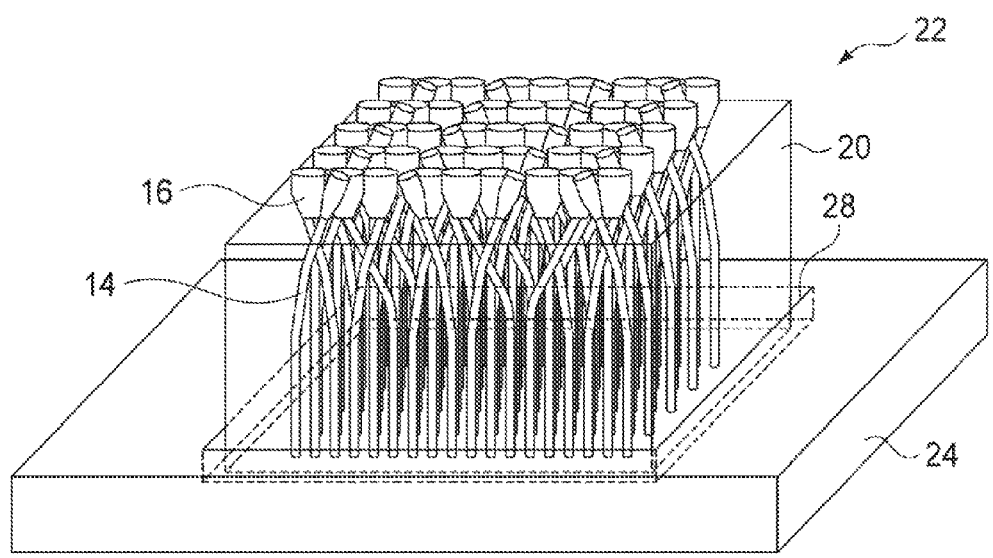
FIG. 13 is a perspective view illustrating a structure of an electronic component according to a second embodiment.

FIG. 13 is a perspective view illustrating a structure of the electronic component according to the present embodiment.

As illustrated in FIG. 13, the electronic component according to the present embodiment is the same as the electronic component according to the first embodiment illustrated in FIG. 1 except that in the former a recess 28 is formed in the heat radiation board 24.

The recess 28 is formed in the part of the heat radiation board 24, where the carbon nanotube sheet 22 is connected. The recess 24 in the heat radiation board 24 can block the transverse spread of the molten thermoplastic resin on the heat radiation board 24 in adhering the carbon nanotube sheet 22 onto the heat radiation board 24. Thus, the scatter of the carbon nanotubes 14 can be effectively prevented, and the increase of the thermal contact resistance and the decrease of the heat conductivity can be suppressed.

As described above, according to the present embodiment, the scatter of the carbon nanotubes is effectively prevented, and the increase of the thermal contact resistance and the decrease of the heat conductivity can be suppressed.

[A Third Embodiment]

An electronic device and a method of manufacturing the same according to a third embodiment will be described with reference to FIGS. 14 to 17.

Figure 14:
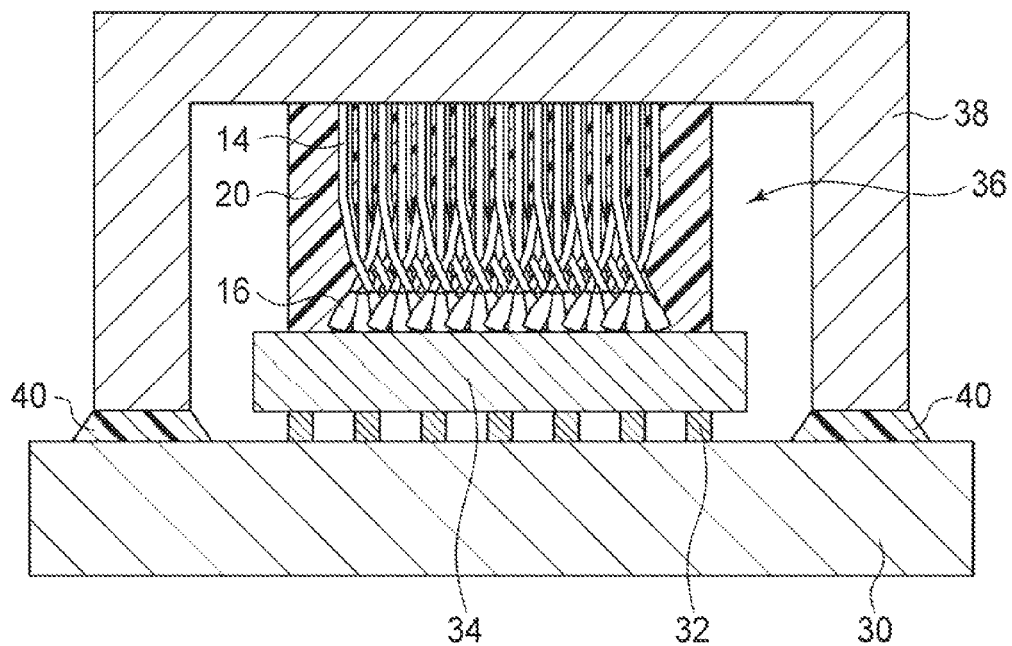
FIG. 14 is a perspective view illustrating a structure of an electronic device according to a third embodiment.
Figure 15:
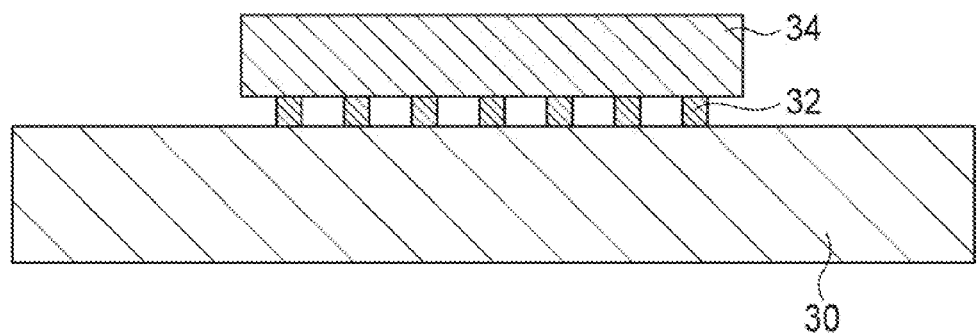
FIGS. 15-17 are sectional views illustrating a method of manufacturing the electronic device according to the third embodiment.
Figure 16:
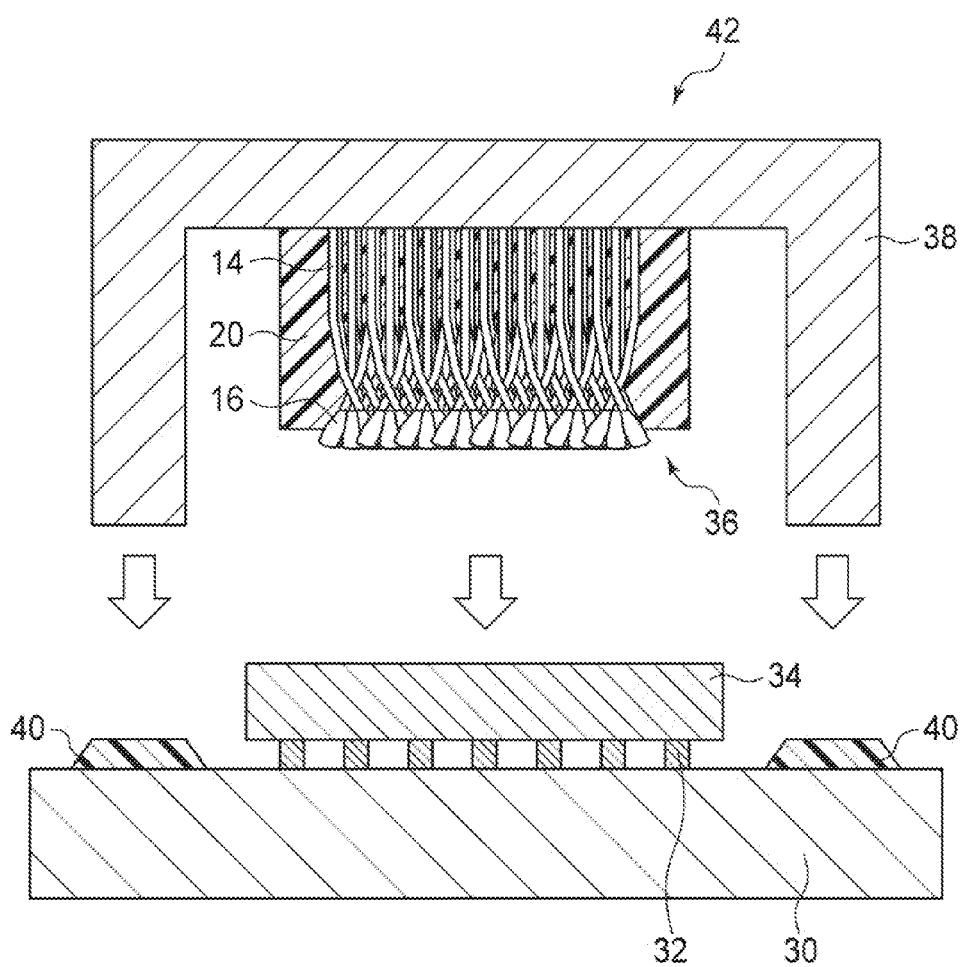
Figure 17:
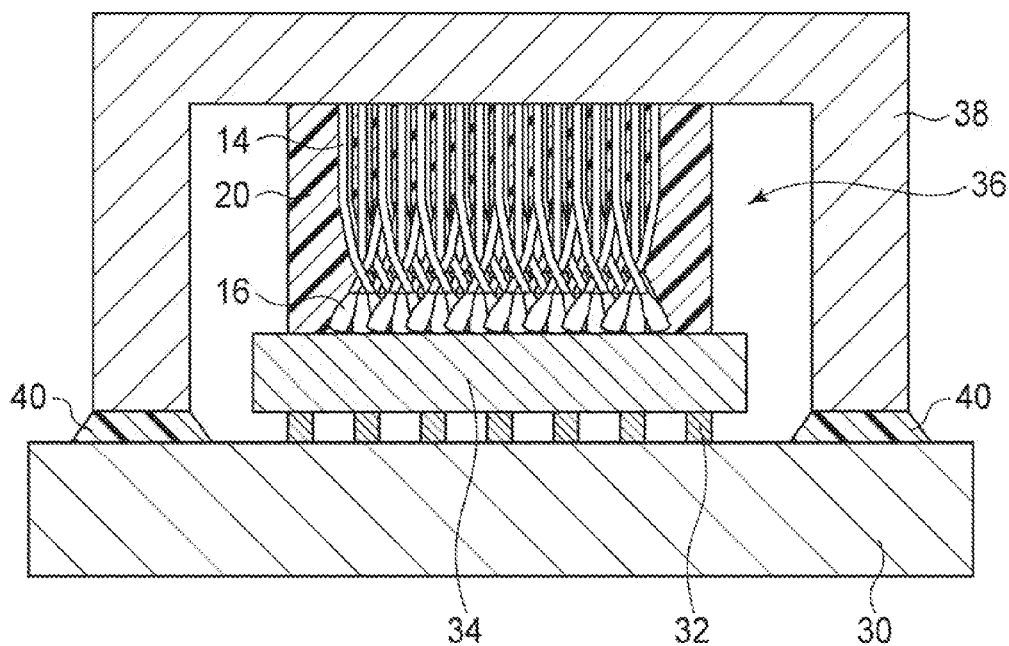

FIG. 14 is a diagrammatic sectional view illustrating a structure of the electronic device according to the present embodiment. FIGS. 15 to 17 are sectional views illustrating the method of manufacturing the electronic device according to the present embodiment.

First, the structure of the electronic device according to the present embodiment will be described with reference to FIG. 14.

Above a substrate 30, such as a circuit board, a built-up substrate or others, a semiconductor element 34, e.g., a CPU or others is mounted. The semiconductor element 34 is electrically connected to the substrate 30 via bump electrodes 32, such as solder bumps or others.

Above the semiconductor element 34, a heat spreader 38 for diffusing the heat from the semiconductor element 34 is formed, covering the semiconductor element 34. Between the semiconductor element 34 and the heat spreader 38, a carbon nanotube sheet 36 as a thermal interface material is formed. The heat spreader 38 is adhered to the substrate 30 with, e.g., an organic sealant 40. The carbon nanotube sheet 36 and the heat spreader 38 are formed of the electronic component according to the first or the second embodiment.

Next, the method of manufacturing the electronic device according to the present embodiment will be described with reference to FIGS. 15 to 17.

First, above the substrate 30, the semiconductor element 34 is mounted via the bump electrodes 32 (FIG. 15).

Next, above the substrate 30, the organic sealant 40 for securing the heat spreader 38 is applied.

Then, above the semiconductor element 34 mounted on the substrate 30, the electronic component 42 according to the first or the second embodiment is mounted (FIG. 16). The electronic component 42 includes the heat spreader 38 and the carbon nanotube sheet 36 connected to the heat spreader 38. The heat spreader 38 corresponds to the heat radiation board 24 of the electronic component according to the first or the second embodiment, and the carbon nanotube sheet 36 corresponds to the carbon nanotube sheet 22 of the electronic component according to the first or the second embodiment.

At this time, the ends of the carbon nanotubes 14 covered by the coating film 16, which are exposed on the surface of the carbon nanotube sheet 36 directly contact the semiconductor element 34.

Then, heat processing is made with a load being applied to the heat spreader 38. For the carbon nanotube sheet 36 using, e.g., "Micromelt 6239" from Henkel Japan Ltd. as the filling layer 20, the heat processing, e.g., of 195° C. and 10 minutes is made with, e.g., a 0.25 MPa load being applied to.

By this heat processing, the thermoplastic resin forming the filling layer 20 of the carbon nanotube sheet is melted and liquefied, and is deformed along the concavities and convexities on the surfaces of the semiconductor element 34 and the heat spreader 38. The carbon nanotubes 14 in the carbon nanotube sheet 36 are less restricted by the filling layer 20 and can flex corresponding to the concavities and convexities of the semiconductor element 34 and the heat spreader 38. Thus, a larger number of the carbon nanotubes 14 directly contacts the semiconductor element 34 and the heat spreader 38, and the thermal contact resistance between the carbon nanotube sheet 36, and the semiconductor element 34 and the heat spreader 38 can be drastically decreased.

Then, the device is cooled to room temperature to solidify the thermoplastic resin of the filling layer while the heat spreader 38 is secured onto the substrate 30 with the organic sealant 40 (FIG. 17). At this time, the thermoplastic resin of the filling layer exhibits the adhesiveness, and the semiconductor element 34 and the heat spreader 38 can be bonded securely by the carbon nanotube sheet 36. Thus, even after the device is cooled to room temperature, the thermal contact resistance between the carbon nanotube sheet 36, and the semiconductor element 34 and the heat spreader 38 can be retained low.

As described above, according to the present embodiment, the electronic device is fabricated by using the electronic component according to the first or the second embodiment, whereby both ends of the carbon nanotubes of the carbon nanotube sheet can be directly contacted to the heat radiation body and the heating body. Thus, the thermal contact resistance between the carbon nanotube sheet, and the heat radiation body and the heating body can be drastically decreased. Thus, the heat radiation efficiency of radiating the heat generated from the semiconductor element can be raised, and the reliability of the electronic device can be increased.

[Modified Embodiments]

The above-described embodiment can cover other various modifications.

For example, in the above-described embodiments, as one example of the heat radiation materials using the linear structure of carbon atoms, the carbon nanotube sheet is described, but the heat radiation material using the linear structure of carbon atoms is not limited to this. The linear structure of carbon atoms is a cylinder of the graphene sheet of the 6-membered ring structure of carbons and includes, other than carbon nanotubes, carbon nanowires, carbon rods, and carbon fibers. These linear structures are the same as carbon nanotubes except that they are different in size. The embodiments are applicable to the heat radiation materials using these linear structures.

In the first embodiment, the carbon nanotube sheet 22 is formed above the substrate 10 different from the heat radiation board 24, and the sheet is adhered to the heat radiation board 24. However, it is possible that the heat radiation board 24 is used in place of the substrate 10, and the carbon nanotube sheet 22 is formed directly on the heat radiation board 24.

The constituent materials and the manufacturing conditions described in the above-described embodiments are not essential and can be changed suitably corresponding to purposes, etc.

The application of the carbon nanotube sheet is not limited to the application described in the above-described embodiments. The described carbon nanotube sheet is applicable as a heat conductive sheet to the heat radiation sheet of the CPUs, high output amplifiers for radio communication stations, high output amplifiers for radio communication terminals, high output switches for electric cars, servers, personal computers, etc.

By using the high allowable current density of carbon nanotubes, the carbon nanotube sheet is applicable to vertical interconnection sheets and various applications using the vertical interconnection sheets.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method of manufacturing an electronic component comprising:
　　disposing a heat radiation material including a plurality of linear structures of carbon atoms and a filling layer of a thermoplastic resin provided among the plurality of linear structures above a first substrate;
　　disposing a blotting paper above the heat radiation material;
　　making a heat treatment at a temperature higher than a melting temperature of the thermoplastic resin and absorbing the thermoplastic resin above the plurality of linear structures with the absorption paper;
　　removing the blotting paper; and
　　adhering the heat radiation material to the first substrate by cooling to solidify the thermoplastic resin.

2. The method of manufacturing an electronic component according to claim 1, wherein
　　in disposing the heat radiation material, the heat radiation material is arranged above the first substrate so that one ends of the plurality of linear structures exposed from the filling layer are in direct contact with the first substrate.

3. The method of manufacturing an electronic component according to claim 1, further comprising after adhering the heat radiation material to the first substrate:
　　exposing other ends of the plurality of linear structures from the filling layer.

4. The method of manufacturing an electronic component according to claim 1, wherein
　　the thermoplastic resin is permeated down to a surface of the first substrate by the heat treatment.

5. The method of manufacturing an electronic component according to claim 1, further comprising after disposing a heat radiation material and before disposing the blotting paper:
　　making a heat treatment at a temperature higher than the melting temperature of the thermoplastic resin to permeate the thermoplastic resin down to the surface of the first substrate.

6. The method of manufacturing an electronic component according to claim 1, wherein
　　the heat treatment is made while a pressure is being applied on the blotting paper.

7. The method of manufacturing an electronic component according claim 1, further comprising before disposing the heat radiation material above the first substrate:
　　growing the plurality of linear structures above a second substrate;
　　disposing a sheet of the thermoplastic resin above the plurality of linear structures;
　　making a heat treatment at a temperature higher than the melting temperature of the thermoplastic resin to permeate the sheet among the plurality of linear structures to form the filling layer; and
　　peeling the plurality of linear structures and the filling layer from the second substrate to obtain the heat radiation material.

8. The method of manufacturing an electronic component according to claim 7, wherein
　　in forming the filling layer, the sheet is so permeated among the plurality of linear structures that the sheet does not reach the second substrate.

9. The method of manufacturing an electronic component according to claim 1, wherein
　　a coating film of a higher heat conductivity than the thermoplastic resin is formed above the other ends of the plurality of linear structures.

10. The method of manufacturing an electronic component according to claim 1, wherein
　　the first substrate is a heat radiation component.

11. The method of manufacturing an electronic component according to claim 1, further comprising:
　　forming a recess in a region of the first substrate where the heat radiation material is to be disposed.

12. The method of manufacturing an electronic component according to claim 7, wherein
　　the first substrate and the second substrate are the same substrate.

* * * * *